(12) United States Patent
Kisslinger da Silva

(10) Patent No.: US 9,678,139 B2
(45) Date of Patent: Jun. 13, 2017

(54) METHOD AND APPARATUS FOR HIGH SIDE TRANSISTOR PROTECTION

(71) Applicant: Continental Automotive Systems US, Inc., Auburn Hills, MI (US)

(72) Inventor: Daniel Kisslinger da Silva, Troy, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 433 days.

(21) Appl. No.: 13/715,323

(22) Filed: Dec. 14, 2012

(65) Prior Publication Data

US 2013/0162284 A1 Jun. 27, 2013
US 2016/0341783 A9 Nov. 24, 2016

Related U.S. Application Data

(60) Provisional application No. 61/579,241, filed on Dec. 22, 2011.

(51) Int. Cl.
   *G01R 31/26* (2014.01)
   *G01R 19/165* (2006.01)
   *H03K 17/082* (2006.01)

(52) U.S. Cl.
   CPC ... *G01R 31/2621* (2013.01); *G01R 19/16519* (2013.01); *H03K 17/0822* (2013.01); *G01R 19/16571* (2013.01); *G01R 19/16576* (2013.01); *H03K 2217/0027* (2013.01)

(58) Field of Classification Search
   CPC .......... G01R 31/2621; G01R 19/16519; G01R 19/16576; G01R 19/16571
   USPC ................................... 324/762.09
   See application file for complete search history.

(56) References Cited

U.S. PATENT DOCUMENTS

| | | | | |
|---|---|---|---|---|
| 5,900,683 A | * | 5/1999 | Rinehart | H03K 17/0828 307/126 |
| 6,580,627 B2 | * | 6/2003 | Toshio | H02M 1/32 363/132 |
| 6,836,173 B1 | * | 12/2004 | Yang | H03K 17/063 326/88 |
| 7,636,227 B2 | * | 12/2009 | Cheng | H02H 1/04 361/93.1 |
| 7,649,364 B2 | * | 1/2010 | Cortigiani | H03K 17/163 324/601 |
| 2002/0070772 A1 | * | 6/2002 | Neacsu | H03K 17/168 327/108 |
| 2004/0047091 A1 | * | 3/2004 | Chang | H02M 1/38 361/33 |

(Continued)

OTHER PUBLICATIONS

In-Hwan Ji, Young-Hwan Choi, Soo-Seong Kim, Kwang-Hoon Oh and Min-Koo Han; The Optimized Monolithic Fault Protection Circuit for the Soft-shutdown behavior of 600V PT-IGBT by employing a New Blanking Filter;Proceedings of the 18th International Symposium on Power Semiconductor Devices & IC's Jun. 4-8, 2006 Naples, Italy.*

*Primary Examiner* — Jermele M Hollington
*Assistant Examiner* — Christopher McAndrew

(57) ABSTRACT

A method and apparatus for detecting a high energy event in a transistor includes performing the steps of: monitoring a gate to source voltage of a transistor during transistor start up, continuously determining a derivative of the monitored gate to source voltage with respect to time, and detecting a high energy event when the derivative of the gate to source voltage exceeds a predetermined threshold.

18 Claims, 3 Drawing Sheets

(56) References Cited

U.S. PATENT DOCUMENTS

| | | | | |
|---|---|---|---|---|
| 2004/0085117 A1* | 5/2004 | Melbert | ............... | H03K 17/168 |
| | | | | 327/432 |
| 2005/0040434 A1* | 2/2005 | Hornkamp | ........... | H03K 17/166 |
| | | | | 257/202 |
| 2006/0120004 A1* | 6/2006 | Thiery | .................... | H03K 4/00 |
| | | | | 361/118 |
| 2007/0069236 A1* | 3/2007 | Capodivacca | ....... | H03K 17/063 |
| | | | | 257/138 |
| 2008/0204087 A1* | 8/2008 | Schwarzer | ........... | H03K 17/567 |
| | | | | 327/109 |
| 2010/0156505 A1* | 6/2010 | Strzalkowski | ....... | H03K 17/163 |
| | | | | 327/419 |
| 2011/0241112 A1* | 10/2011 | Zuniga | ................ | H01L 29/1095 |
| | | | | 257/343 |

* cited by examiner

METHOD AND APPARATUS FOR HIGH SIDE TRANSISTOR PROTECTION

CROSS-REFERENCE TO RELATED APPLICATIONS

This application claims priority to U.S. Provisional Application No. 61/579,241, which was filed on 22 Dec. 2011.

TECHNICAL FIELD

The present disclosure is directed toward transistor monitoring, and more specifically toward high-side Metal Oxide Semiconductor Field Effect Transistor (MOSFET) monitoring for a direct injection driver in a powertrain Electronic Control Unit (ECU).

BACKGROUND OF THE INVENTION

Powertrain electric control units (ECUs) for vehicles, such as cars, utilize high side transistors (transistors that switch a high voltage side of a load) and low side transistors (transistors that switch a low ground side of a load) to control the inputs to and outputs from the ECUs. High amounts of energy can be dissipated in a high side transistor during a high energy event, such as a short circuit to ground or a battery fault causing a voltage spike. Dissipation of the energy from the high energy event can damage the high side transistor.

One currently used way to protect the high side transistor from such an event is to utilize a sense resistor in series with the high side transistor and monitor the voltage across the sense resistor in real time using a voltage monitoring circuit. When the voltage monitoring circuit detects a voltage in excess of a predefined threshold, the high side transistor is turned off, preventing excess power dissipation within the high side transistor. This technique provides highly accurate results, however the monetary and weight costs associated with utilizing an appropriately sized sense resistor and voltage monitoring circuit are cost prohibitive for some applications, such as vehicle control units.

Another approach used to protect high side transistors from a high energy event involves monitoring a drain to source node voltage of the high side transistor. In this approach, when the drain to source node voltage exceeds a predetermined threshold, with the high side transistor is saturated, the monitor detects that a high energy event is occurring and appropriate action is taken to protect the transistor. Due to the nature of MOSFET type transistors, however, there is a time period after receiving a control signal turning the transistor on and before the transistor is fully on or saturated. Within that time period the voltage across the drain to source nodes of the transistor steadily declines to zero volts, and during the switching on time period a high energy event is not detectable across the drain to source modes of the transistor. As a result, protection circuits cannot respond to high energy events occurring during the switching time period, and the high side transistor can be damaged.

SUMMARY OF THE INVENTION

Disclosed is a method for detecting a high energy event in a transistor including the steps of: monitoring a gate to source voltage of a transistor during transistor start up, continuously determining a derivative of the monitored gate to source voltage with respect to time, and detecting a high energy event when the derivative of the gate to source voltage exceeds a predetermined threshold.

Also disclosed is a transistor protection circuit including a transistor having a gate node, a source node, and a drain node, a differentiator connected to the gate node at a first input and the drain node at a second input, wherein the differentiator has a differential output, a timer block connected to the differential output, wherein the timer block includes a control scheme operable to cause the timer block to perform the step of detecting a high energy event when the derivative of the gate to source voltage exceeds a predetermined threshold after an initial blank time has elapsed.

These and other features of the present invention can be best understood from the following specification and drawings, the following of which is a brief description.

DETAILED DESCRIPTION OF AN EMBODIMENT

Figure 1:
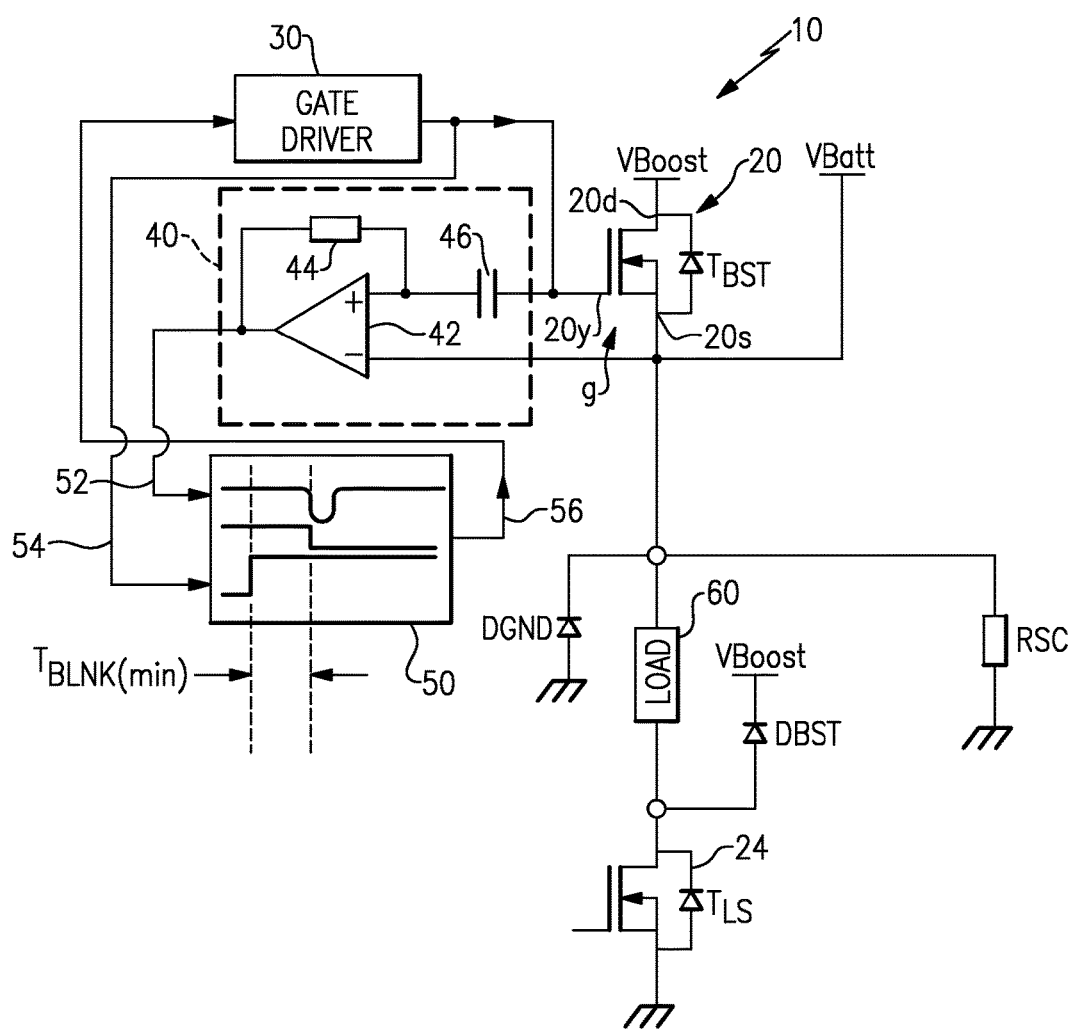
FIG. 1 illustrates an example direct injection driver circuit for a powertrain electrical control unit including a high side transistor protection scheme.

FIG. 1 illustrates a direct injection driver circuit 10 for a powertrain electrical control unit (ECU), including a protection scheme for a high side transistor 20. The high side transistor 20 includes a drain node 20*d*, a gate node 20*y* and a source node 20*s*. The drain node 20*d* is connected to a power source VBoost, and the high side transistor 20 controls the connection of the power source VBoost to a drain node of a second transistor 22 and a load 60. The load 60 is fuel injector. A controller 30, including a gate driver, is connected to the gate node 20*y* of the high side transistor 20, and controls the operational state of the high side transistor 20 with a high gate driver output turning on the high side transistor 20 and a low gate driver output turning off the high side transistor 20. A low side transistor 24 connects the load 60 to a ground or neutral point. A similar or identical protection scheme can be applied to the second transistor 22 to achieve the same effect.

Also connected to the gate node 20*y* is one input of a differentiator 40. A second input of the differentiator 40 is connected to the source node 20s of the high side transistor 20. This connection arrangement allows the differentiator 40 to measure the gate to source voltage of the high side transistor 20 and to output a erivative with respect to time of the measured gate to source voltage. The output of the differentiator 40 is connected to an input 52 of a timer block 50. The differentiator 40 includes an operational amplifier 42, a resistor 44 and a capacitor 46 arranged in a standard differentiator configuration. The timer block 50 also receives a gate driver output as an input 54. The timer block 50 is connected to the gate driver in controller 30, and includes an output 56 that sends a warning signal to the controller 30 when a high energy event, such as a short to ground or a battery fault, is detected. The second transistor 22 can also be protected via a similar protection circuit.

During operation of the circuit 10, the gate driver in the controller 30 turns the high side transistor 20 on. The gate driver output is also provided to the timer block 50 via timer block input 54, and the timer block 50 begins operating simultaneous to the high side transistor 20 turning on (when the gate driver output from the controller 30 goes high). When the high side transistor 20 initially turns on, the gate to source voltage of the high side transistor 20 begins ramping up to a Miller Plateau region, and then steadies off for the duration of the Miller Plateau region. Once the duration of the Miller Plateau has elapsed, the gate to source voltage of the high side transistor 20 begins climbing again until it reaches a steady closed operating voltage. The differentiator 40 provides a continuing derivative with respect to time of the gate to source voltage of the high side transistor 20 with respect to time to the timer block 50 via input 52. When a pre-defined blank time period has expired, the timer block 50 compares the derivative of the gate to source voltage of the high side transistor 20 to a preset threshold and determines that a high energy event is occurring if the derivative with respect to time exceeds the threshold.

The derivative with respect to time of the gate to source voltage of the high side transistor 20 reflects the rate of change of the gate to source voltage. Thus, the derivative value of a properly operating high side transistor 20 is at or near zero until the end of the Miller Plateau period because the gate to source voltage stays steady during the Miller Plateau. Alternatively, the derivative value of a high side transistor 20 experiencing a high energy event during the Miller Plateau is significantly above zero.

The preset time period utilized in the timer block 50 before which the derivative value is compared to a threshold is referred to as the blank time, is defined during assembly of the circuit, and is set to a time period that is shorter than the time period from the gate driver turning the high side transistor 20 on to the end of the Miller Plateau. In some examples, the blank time period of the transistor protection scheme is less than half the time period from transistor turns on until the end of the Miller Plateau.

The illustrated differentiator 40 is a standard operational amplifier (Op-Amp) differentiator and uses the capacitor 46 and the resistor 44 to define the constants of the differentiator 40. Alternate styles of differentiators, or alternate methods of differentiating the gate to source voltage of the high side transistor 20, can be used to the same affect and require minimal alteration to the illustrated circuit. One example alternate that can be used is a software based differentiator in the controller 30 and a standard voltage probe connected to the gate node 20y and the source node 20s of the high side transistor 20.

Figure 2:
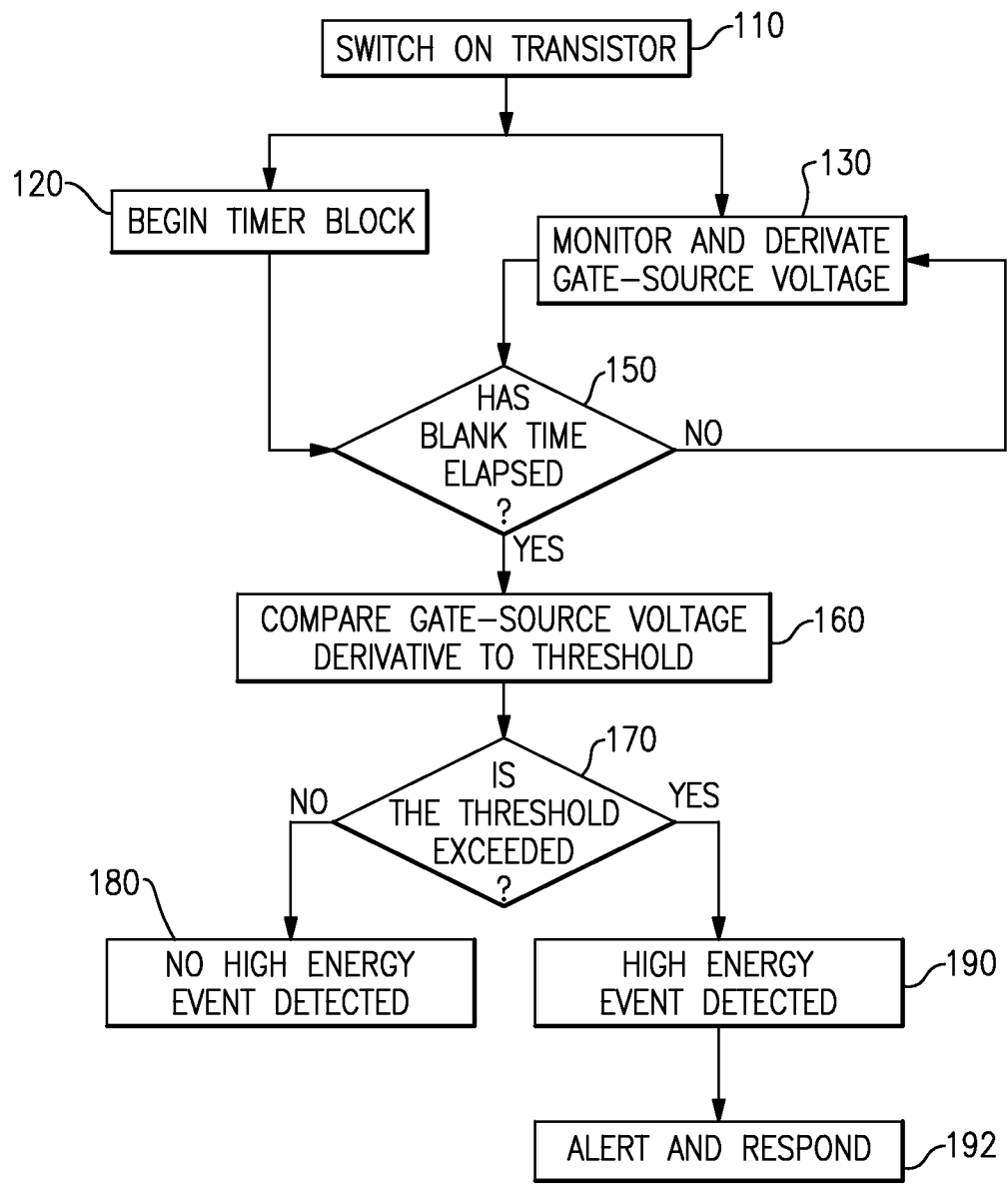
FIG. 2 illustrates a flowchart demonstrating a method for identifying high energy events in a high side transistor.

FIG. 2 illustrates a flowchart demonstrating the method performed by the circuit described above (and illustrated in FIG. 1) in greater detail. Initially, the gate driver in the controller 30 turns on the high side transistor 20 in a "switch on transistor" step 110. Once the gate driver outputs the on signal, the timer block 50 also begins a blank timer in a "Begin Timer Block" step 120 and the voltage differentiator 40 begins monitoring the gate-source voltage in a "Monitor and derivate gate to Source Voltage" step 130. Both the "Begin Timer Block" step 120 and the "Monitor and derivate gate to Source Voltage" step 130 begin simultaneously. The blank time is an amount of time required for the derivative of the gate to source voltage of the high side transistor to reflect the Miller Plateau and to level off at approximately 0. In addition to monitoring the drain-source voltage of the high side transistor 20, the voltage differentiator 40 also continuously determines a derivative with respect to time of the monitored drain to source voltage in the "Monitor and Derivate gate to Source Voltage" step 130. The derivative value (the output of the differentiator 40) is passed to the timer block 50.

The timer block 50 continuously checks to determine if the blank time period has elapsed in a "Has Blank Time Elapsed" step 150. If the blank time period has not elapsed, the method continues monitoring the drain to source voltage in the monitor and derivate gate to source voltage step 130.

When blank time has elapsed, the process compares the continuous derivative with respect to time of the gate-source voltage of the high side transistor 20 to a threshold in a "Compare Gate—Source Voltage Derivative to Threshold" step 160. If the threshold is exceeded in a comparison step 170, the controller 30 determines that a high energy event has occurred in a "High Energy Event Detected" step 190. If, the threshold is not exceeded in comparison step 170, the controller determines that no high energy event is occurring in a "No High Energy Event Detected" step 180.

When a high energy event is detected by the controller 30, an alert is created, and the controller 30 responds to the high energy event in an "Alert and Respond" step 192. In one example response to a high energy event, the high side transistor 20 is immediately switched to an open mode. Switching the high side transistor 20 open protects the high side transistor 20 from excess energy dissipation by preventing any energy from passing through the transistor 20, and extends the expected life cycle of the transistor.

Figure 3:
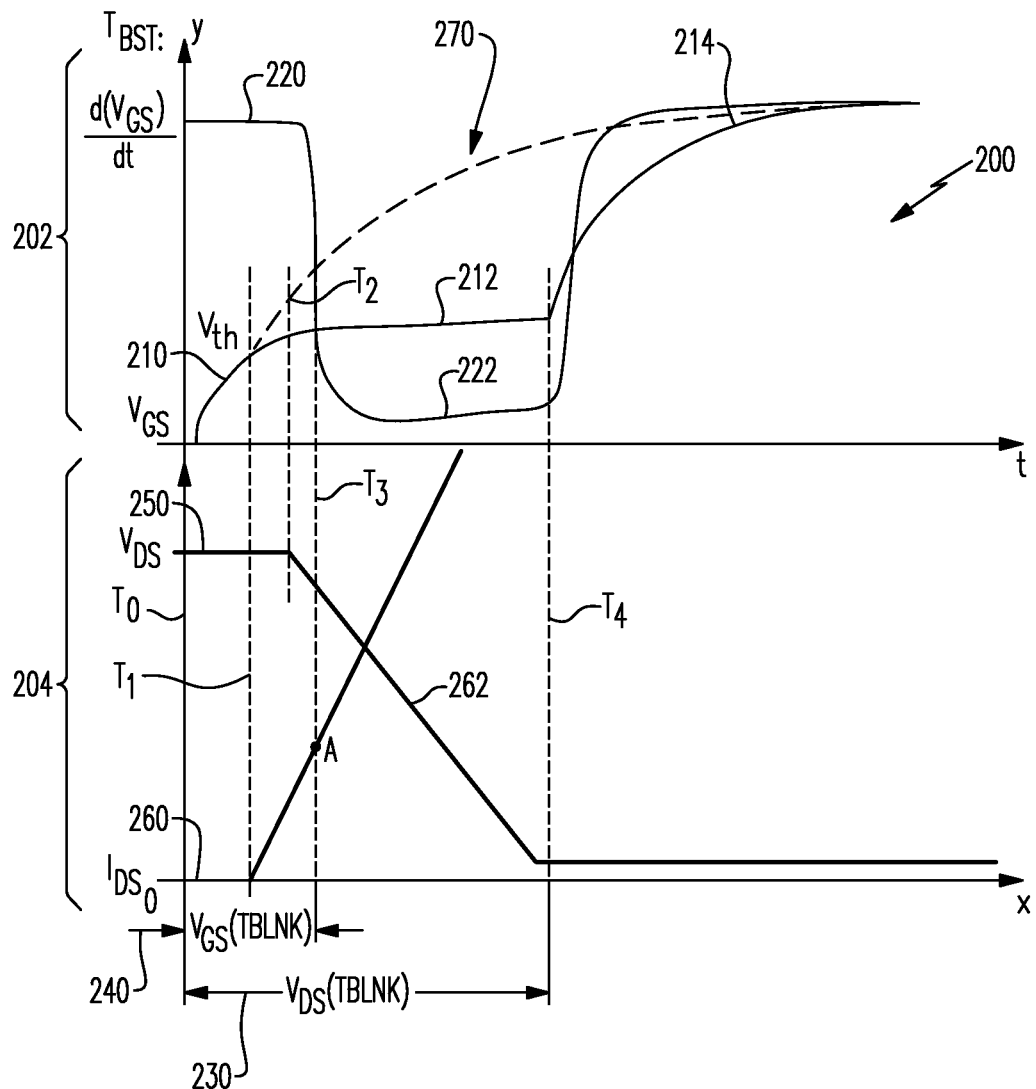
FIG. 3 illustrates a graph demonstrating sample voltages and currents across a high side transistor of a direct injection driver circuit during standard operation of a powertrain electric control unit operation.

FIG. 3 illustrates a graph 200 demonstrating sample voltages and currents across a high side transistor 20 during standard operation of a powertrain electric control unit. The graph 200 includes a gate to source voltage section 202 and a drain to source voltage and current section 204.

Illustrated in the gate to source voltage section is a gate to source voltage 210 and a derivative 220 with respect to time of the gate to source voltage 210. The X axis of the graph 200 starts at T=0, where T is the time and T=0 is the initial time at which the high side transistor 20 receives an on signal. When the high side transistor 20 is initially switched on, at T0, the gate to source voltage 210 begins ramping up to a Miller Plateau region 212 that is reached at T2. The Miller Plateau region 212 lasts between T2 and T4, after which the gate to source voltage 210 begins rising steadily to a closed region 214. The derivative 220 of the gate to source voltage 210 is a high value until T2 when a Miller Plateau region 222 is entered. Shortly after the Miller Plateau region 222 is entered, the derivative value 220 falls to almost 0, at T3, and remains steady at almost 0 until T4, when the gate to source voltage exits the Miller Plateau region 222. At T4, the derivative value 220 rises until it evens out at the same value as the gate to source voltage 210 in the closed region 214.

If, however, a high energy event occurs during the Miller Plateau region 212, 222, the derivative value 220 will not fall to near zero during transistor switch on, and will remain high relative to the expected derivative valve. The gate to source voltage of the transistor 20 during a high energy event is illustrated as a dashed line 270. Thus, the timer block 50 can compare the derivative value 220 to a threshold shortly after T3, where the derivative value 220 has dropped corresponding to the Miller Plateau. As can be seen in the graph 200, the time period from T0 to T3 (time and period 240) is significantly shorter than the time period from T0 to T4 (the switch on time period 230). In some examples, the time period from T0 to T3 (time period 240) is less than half the time period from T0 to T4 (the switch on time period 230). Thus, the disclosed protection scheme can detect a high energy event occurring during switching significantly earlier than a system using the drain to source voltage, which cannot detect a high energy event until after the high side transistor 20 is fully on.

The drain to source voltage and current section 204 illustrates the voltage measurements, and the current measurements of the drain to source nodes 20d, 20s of the high side transistor 20. As can be seen, in the Miller Plateau region 262, the drain to source voltage is steadily declining until it reaches close to 0 volts at T4, when the Miller Plateau region is exited. The drain to source current 260 is at 0 amps when the transistor 20 is closed and begins ramping up from 0 at T1. A high energy event occurring during the switch on time period 230 (between T0 and T4) induces a current spike. However, as the current is ramping up during that time period, the current spike is not noticed by threshold detection and the drain to source voltage can not be used to detect high energy events before the transistor is fully on.

While the above disclosure is described with regards to high side transistor protection for a direct injection driver electrical control unit, it is understood that similar protection schemes can be applied to any MOSFET, and are not limited applications within a direct injection driver. Similarly the protection scheme is likewise functional to protect low side transistors from high energy events occurring within an ECU, or high energy events originating on a neutral line. Thus, the disclosed protection scheme can be utilized in conjunction with any MOSFET with minimal modification and still fall within the instant disclosure.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A method for detecting a high energy event in a transistor, the method comprising:
    simultaneously:
       monitoring a gate to source voltage of the transistor during transistor start up; and
       monitoring a timer block configured to determine when a blank time has elapsed;
    continuously determining a derivative of the monitored gate to source voltage with respect to time; and
    comparing the derivative of the gate to source voltage to a predetermined threshold when the blank time has elapsed:
       when the derivative of the gate to source voltage exceeds the predetermined threshold:
          detecting a high energy event; and
          switching the transistor open; and
       when the derivative of the gate source voltage does not exceed the predetermined threshold, detecting that a high energy event has not occurred.

2. The method of claim 1, wherein the blank time is a time period for the derivative with respect to time to reflect the gate to source voltage entering a Miller Plateau region.

3. The method of claim 1, wherein the blank time is less than a time period required for the gate to source voltage to exit a Miller Plateau region.

4. The method of claim 3, wherein the blank time is less than half of the time period required for the gate to source voltage to exit a Miller Plateau region.

5. The method of claim 1, wherein monitoring the gate to source voltage of the transistor during transistor start up and determining a derivative of the monitored gate to source voltage with respect to time are performed by a hardware differentiator.

6. The method of claim 5, wherein the hardware differentiator is an Op-Amp differentiator.

7. The method of claim 1, wherein monitoring the gate to source voltage of the transistor during transistor start up is performed by a voltage probe and determining the derivative of the monitored gate to source voltage with respect to time is performed by a software differentiator.

8. The method of claim 1, wherein monitoring the gate to source voltage of the transistor during transistor start up comprises monitoring a metal-oxide semiconductor field effect transistor (MOSFET).

9. The method of claim 8, wherein the MOSFET is a high side transistor inside an electrical control unit.

10. The method of claim 8, wherein the MOSFET is in a direct injection driver for a powertrain electrical control unit.

11. A transistor protection circuit comprising:
    a transistor including a gate node, a source node, and a drain node;
    a controller having a controller output connected to the gate node of the transistor, the controller configured to switch the transistor on;
    a differentiator connected to the gate node at a first input and the source node at a second input, wherein the differentiator has a differential output of a derivative of the gate to source voltage;
    a timer block connected to the differential output and to the controller output, the timer block includes a control scheme, wherein after an initial blank time has elapsed, the control scheme is operable to cause the timer block to:
       detect a high energy event when the derivative of the gate to source voltage exceeds a predetermined threshold; and
       fail to detect a high energy event when the derivative of the gate to source voltage does not exceed the predetermined threshold.

12. The transistor protection circuit of claim 11, wherein the initial blank time is a time required for the differential output to reflect a gate to source voltage of the transistor entering a Miller Plateau region.

13. The transistor protection circuit of claim 12, wherein the blank time is less than a time required for the gate to source voltage of the transistor to exit the Miller Plateau region.

14. The transistor protection circuit of claim 13, wherein the blank time is at least 50% shorter than the time required for the gate to source voltage of the transistor to exit the Miller Plateau region.

15. The transistor protection circuit of claim 14, wherein the transistor is a metal oxide semiconductor field effect transistor (MOSFET).

16. The transistor protection circuit of claim 11, wherein the transistor is a high side input transistor for an electrical control unit.

17. The transistor protection circuit of claim 16, wherein the transistor is in a direct injection driver in a powertrain electrical control unit.

18. A method for detecting a high energy event in a transistor, the method comprising:
    simultaneously:
       monitoring a gate to source voltage of a transistor during transistor start up;
       monitoring a timer block configured to determine when a blank time has elapsed;

continuously determining a derivative of the monitored gate to source voltage with respect to time;
detecting a high energy event when the derivative of the gate to source voltage exceeds a predetermined threshold, the high energy event being detected as a result of the derivative of the gate to source voltage exceeding the predetermined threshold;
detecting that a high energy event has not occurred when the derivative of the gate to source voltage fails to exceed the predetermined threshold; and
switching the transistor open when the high energy event is detected.

* * * * *